United States Patent
Shimonosono et al.

(10) Patent No.: US 6,984,264 B2
(45) Date of Patent: Jan. 10, 2006

(54) SINGLE CRYSTAL PULLING DEVICE AND METHOD AND SUPERCONDUCTING MAGNET

(75) Inventors: Tsutomu Shimonosono, Yokohama (JP); Yoshihiro Koguchi, Yokohama (JP); Takashi Sasaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/448,343

(22) Filed: May 30, 2003

(65) Prior Publication Data

US 2004/0107894 A1    Jun. 10, 2004

(30) Foreign Application Priority Data

May 31, 2002   (JP) .............................. 2002-160514

(51) Int. Cl.
*C30B 15/20*   (2006.01)
(52) U.S. Cl. ..................... 117/30; 117/32; 117/201; 117/213; 117/218; 117/917
(58) Field of Classification Search ................. 117/30, 117/32, 201, 917, 213, 218

See application file for complete search history.

(56) References Cited

U.S. PATENT DOCUMENTS

| | | | | |
|---|---|---|---|---|
| 5,851,283 A | * | 12/1998 | Hoshi et al. | 117/32 |
| 5,938,836 A | * | 8/1999 | Tomioka et al. | 117/30 |
| 6,423,285 B1 | * | 7/2002 | Itoi et al. | 423/328.2 |

FOREIGN PATENT DOCUMENTS

JP        2001-203106        7/2001

* cited by examiner

*Primary Examiner*—Robert Kunemund
(74) *Attorney, Agent, or Firm*—Oblon, Spivak, McClelland, Maier & Neustadt, P.C.

(57) ABSTRACT

A single crystal pulling device is composed of a cylindrical pulling furnace, a crucible disposed in the pulling furnace in which a single crystal material for a semiconductor is poured, a cylindrical vacuum vessel coaxially disposed around the pulling furnace, and a superconducting magnet composed of a plurality pairs of coils arranged inside the vacuum vessel so as to generate magnetic field. The superconducting coils are arranged on the same horizontal plane of the cylindrical vacuum vessel, and each of the paired superconducting coils includes coils set so as to oppose to each other with respect to a central axis of the cylindrical vacuum vessel so that one coil of one pair of coils and one coil of another pair of coils adjacent to that one pair of coils constitutes a set angle, directing towards the inside of the cylindrical vessel, in a range of 100° to 130°.

13 Claims, 12 Drawing Sheets

θ = 113deg

θ =100deg

θ =110deg

θ =115deg

θ =120deg $\theta = 130 \text{deg}$ $\theta = 90 \text{deg}$

θ = 140deg

6coils

SINGLE CRYSTAL PULLING DEVICE AND METHOD AND SUPERCONDUCTING MAGNET

BACKGROUND OF THE INVENTION

1. Field of the Invention

The present invention relates to a single-crystal pulling device and a single-crystal pulling method used to manufacture a single crystal and a superconducting magnet applicable to the single-crystal pulling device.

2. Related Art

A semiconductor such as silicon or gallium arsenide consists of a single crystal, and is used for a memory device and the like of a computer having various sizes. It is therefore required for such memory device to be increased in its capacity, be produced at a reduced cost, and improved in its quality.

In order to satisfy these requirements, prior art provides, as one single-crystal pulling method for manufacturing a single crystal, a method in which a magnetic field is applied to a semiconductor material set in a molten state and accommodated in a crucible. In this arrangement, heat convection generated in the melt is suppressed to manufacture a semiconductor having a large diameter and high quality. This method is generally called the Czchoralsk (CZ) method.

An example of a single-crystal pulling device using the conventional CZ method will be described below with reference to FIG. 18. This single-crystal pulling device comprises a pulling furnace 1 which has an opened upper end in an installed (i.e., illustrated) state and in which a crucible 2 is built. Inside the pulling furnace 1, a heater 3 for heating and melting a semiconductor material in the crucible 2 is arranged around the crucible 2, and outside the pulling furnace 1, a superconducting magnet (or magnet device) 30 is arranged. A cylindrical vessel 5 for cooling medium or coolant (i.e., coolant vessel 5), is arranged in the superconducting magnet 30, which includes a pair of superconducting coils 4 (4a and 4b).

In a manufacturing process of a single crystal, a semiconductor material 6 is put in the crucible 2 and heated by the heater 3 so as to melt the semiconductor material 6. A seed crystal, not shown, is downwardly inserted into the crucible 2 through the upper opening, and the seed crystal is then pulled up in the pulling direction 8, vertically as shown, by a pulling machine, not shown, at a predetermined speed. In this manner, crystal is grown in a boundary layer between a solid substance and a liquid substance to thereby generate and form a single crystal. At this time, when the fluid motion of the melt (i.e. molten solution) induced by a heat from the heater 3, i.e., heat convection, is generated, the melt to be pulled up is disturbed, and the yield of single-crystal generation is deteriorated.

Therefore, in order to eliminate such defect or inconvenience, there is provided the superconducting magnet 30 comprising the superconducting coils 4. More specifically, according to the arrangement of such superconducting coils 4, a motion suppressing force is applied to the semiconductor material 6 of the melt by magnetic lines 7 generated by conducting electricity to the superconducting coils 4, and by slowly pulling up the semiconductor material 6 in accordance with the pulling operation of the seed crystal without being convected in the crucible 2. In this manner, so-called a solid-state single crystal 9 is manufactured. Further, in this operation, above the pulling furnace 1, there is arranged a pulling machine for pulling the single crystal 9 along a center line 10 of the crucible 2.

An example of the superconducting magnet 30 used in the single-crystal pulling device of FIG. 18 will be explained hereunder with reference to FIG. 19. The superconducting magnet 30 is constituted by accommodating the superconducting coils 4 (4a and 4b) in a cylindrical vacuum vessel 19 through the cylindrical vessel 5 for coolant, cooling medium or refrigerant, which may be called hereinlater as coolant vessel 5. In the superconducting magnet 30, a pair of superconducting coils 4a and 4b are arranged so as to oppose to each other with reference to a central axial line of the cylindrical vacuum vessel 19 on a horizontal plane. The pair of superconducting coils 4a and 4b are Helmholtz coils which generate a magnetic field along the same transverse direction. As shown in FIG. 18, the magnetic lines 7 which are symmetric with respect to the center line 10 of the cylindrical vacuum vessel 19 are generated and this position of the center line 10 is called as a center of magnetic field.

The superconducting magnet 30 further includes a current lead 11 for guiding a current to the two superconducting coils 4a and 4b, a small helium refrigerator 12 for cooling a first radiation shield 17 and a second radiation shield 18 accommodated in the coolant vessel 5, a gas discharge pipe 13 for discharging a helium gas in the coolant vessel 5, and a service port 14 having a resupply port for resupplying liquid helium. The superconducting magnet 30 has a bore 15, having an upper opening, in which the pulling furnace 1 shown in FIG. 18 is arranged.

FIG. 20 shows a magnetic field distribution of the conventional superconducting magnet 30 of the structure described above. As shown in FIG. 20, in the conventional superconducting magnet 30, a pair of superconducting coils 4a and 4b are arranged so as to oppose to each other. Therefore, the magnetic field gradually increases in size towards the coils in a coil arrangement direction (X-direction), and the magnetic field gradually vertically decreases in size in a direction (Y-direction) perpendicular to the coil arrangement direction. In the conventional configuration described above, because a magnetic field gradient in a bore (opening) range is excessively large as shown in FIG. 20, an effect of suppressing heat convection generated in the melt is unbalanced, and hence, magnetic field efficiency becomes poor.

More specifically, as indicated by a hatched area in FIG. 20, in a region near the center of magnetic field, the magnetic field is not uniform (that is, the magnetic field has a shape of cross which is horizontally and vertically thin and long). For this reason, the suppressing accuracy of heat convection becomes poor, and it is hence difficult to pull up a single crystal having high quality.

SUMMARY OF THE INVENTION

The present invention was conceived in consideration of the above circumstances of prior art and has an object to provide a single-crystal pulling device and method capable of pulling up a high-quality single crystal with a high yield under a generation of uniform magnetic field.

Another object of the present invention is to provide a superconducting magnet which can generate a uniform transverse magnetic field having a small magnetic-field gradient, particularly for the single-crystal pulling device.

These and other objects can be achieved according to the present invention by providing, in one aspect, a single-crystal pulling device comprising:

a cylindrical pulling furnace;

a crucible disposed in the pulling furnace so as to melt a single-crystal material for a semiconductor poured therein;

a cylindrical vacuum vessel coaxially disposed around an outer periphery of the pulling furnace; and a superconducting element disposed in the vacuum vessel so as to generate magnetic field which is applied to the single-crystal material to thereby suppress a convection of the melted single-crystal material in the crucible, wherein the superconducting element comprises at least two pairs of superconducting coils arranged on a same horizontal plane of the cylindrical vacuum vessel, and each of the paired superconducting coils includes coils set so as to oppose to each other with respect to a central axis of the cylindrical vacuum vessel so that one coil of one pair of coils and one coil of another pair of coils adjacent to that one pair of coils constitutes a set angle, directing towards the inside of the cylindrical vessel, in a range of 100° to 130°.

In preferred embodiment of this aspect, the space distance between the opposing superconducting coils is set to be 1.1 to 1.25 times a diameter of an opening of the cylindrical vacuum vessel. Each of these superconducting coils has a diameter which is 0.35 to 0.55 times the diameter of the opening of the cylindrical vacuum vessel.

In another aspect of the present invention, there is also provided a single-crystal pulling method, which is performed by using a single-crystal pulling device which comprises a cylindrical pulling furnace, a crucible disposed in the pulling furnace, a cylindrical vacuum vessel coaxially disposed around the pulling furnace, and a superconducting element disposed in the vacuum vessel, wherein a single-crystal material is poured in the crucible, then heated and melted, a seed crystal is inserted into the crucible from an upper portion thereof and the single crystal material is thereafter pulled up at a predetermined speed, while applying a magnetic field generated by the superconducting element to thereby suppress a convection of the melted single crystal material in the crucible, and the superconducting element comprises at least two pairs of superconducting coils arranged on a same horizontal plane of the cylindrical vacuum vessel, and each of the paired superconducting coils includes coils set so as to oppose to each other with respect to a central axis of the cylindrical vacuum vessel so that one coil of one pair of coils and one coil of another pair of coils adjacent to that one pair of coils constitutes a set angle, directing towards the inside of the cylindrical vessel, in a range of 100° to 130°.

In a further aspect of the present invention, there is provided a superconducting magnet comprising:

a cylindrical vacuum vessel; and a superconducting element disposed in the cylindrical so as to generate magnetic field, the superconducting element comprising at least two pairs of superconducting coils arranged on a same horizontal plane of the cylindrical vacuum vessel, and each of the paired superconducting coils includes coils set so as to oppose to each other with respect to a central axis of the cylindrical vacuum vessel so that one coil of one pair of coils and one coil of another pair of coils adjacent to that one pair of coils constitutes a set angle, directing towards the inside of the cylindrical vessel, in a range of 100° to 130°.

In preferred embodiments of this aspect, the space distance between the opposing superconducting coils is set to be 1.1 to 1.25 times a diameter of an opening of the cylindrical vacuum vessel. Each of these superconducting coils has a diameter which is 0.35 to 0.55 times the diameter of the opening of the cylindrical vacuum vessel.

The superconducting coil may have a shape of either one of racetrack shape, elliptical shape and rectangular shape, which is elongated in the axial direction of the vacuum vessel.

The superconducting magnet may further comprises a coolant vessel, coaxially disposed in the cylindrical vacuum vessel. In this embodiment, the superconducting coils are disposed in the coolant vessel in which a liquid cooling medium is filled up. The superconducting coils may be arranged so as to be contacted to the coolant vessel, or connected to a low-temperature portion of a refrigerator.

The cylindrical vacuum vessel has a wall section, on the outside of the superconducting coils, formed from a magnetic material.

According to the superconducting magnet of the present invention, a uniform transversal magnetic field having a small magnetic-field gradient can be generated inside the cylindrical vacuum vessel. In addition, the coaxial or square magnetic field distribution can be generated on the horizontal same plane, and an imbalanced electromagnetic force can be hence considerably suppressed.

Furthermore, according to a single-crystal pulling device of the present invention, which utilizes the superconducting magnet of the characters mentioned above, the uniform magnetic field region in a pulling direction is created, and a magnetic field in the direction of a transverse magnetic field is almost horizontal, and a high-quality single crystal can be manufactured by suppressing an imbalanced electromagnetic force.

The nature and further characteristic features will be made more clear from the following descriptions made with reference to the accompanying drawings.

DESCRIPTION OF THE PREFERRED EMBODIMENTS

Figure 1:
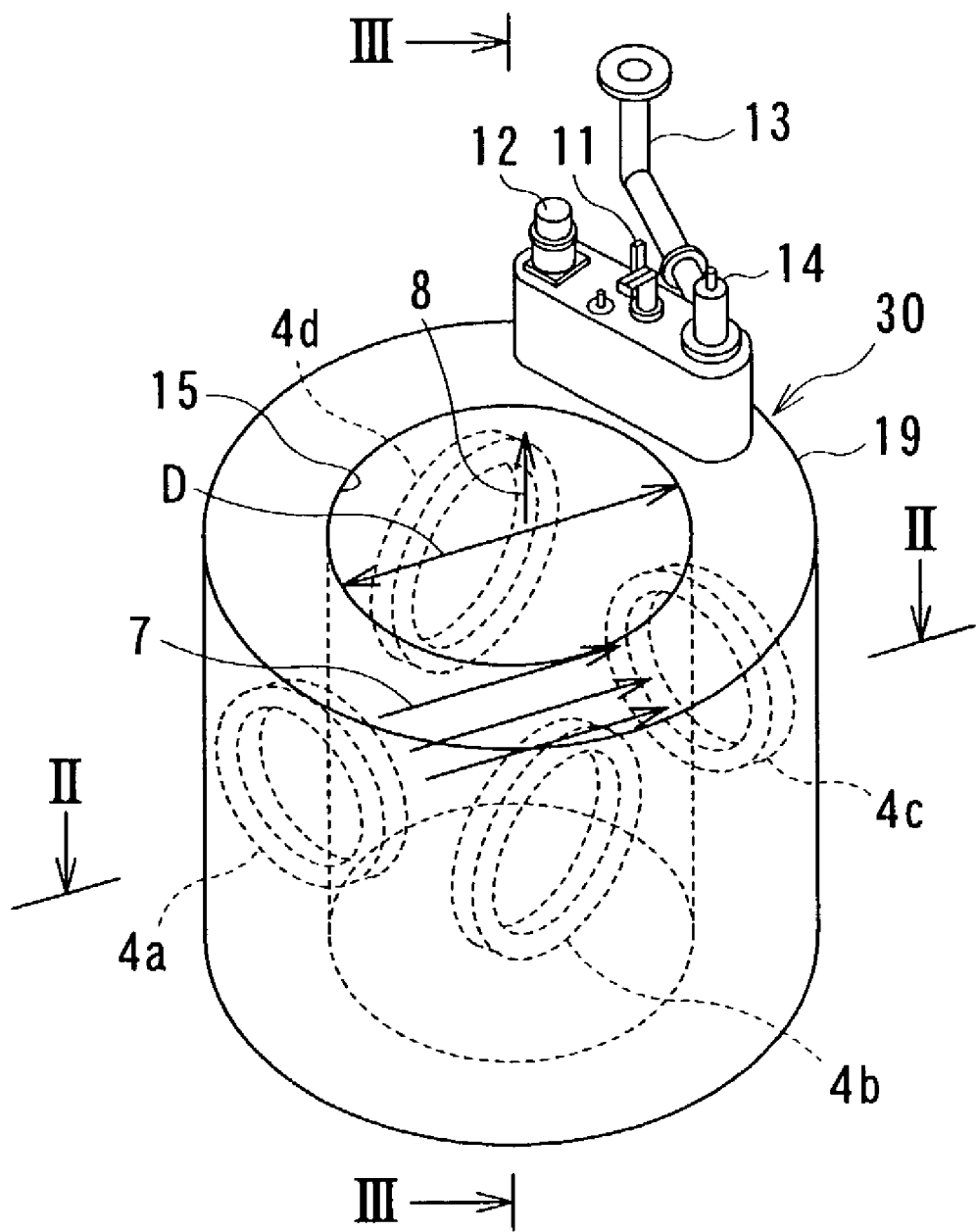
FIG. 1 is a perspective view partially schematically showing an embodiment of a superconducting magnet according to the present invention.

Embodiment of the present invention will be described hereunder with reference to FIGS. 1 to 17.

First, with reference to FIGS. 1 and 2, an entire superconducting magnet 30 of one embodiment of the present invention will be explained.

A cylindrical vessel 5 for coolant, cooling medium or refrigerant is arranged as a cooling vessel in a cylindrical vacuum vessel 19, which may be called hereinlater coolant vessel 5. Four superconducting coils 4a, 4b, 4c, and 4d are accommodated in the coolant vessel 5, and a current lead 11 for guiding a current is connected to the vacuum vessel 19. A small helium refrigerator 12 for cooling first and second radiation shields 17 and 18, a service port 14 having a filling port and a helium gas discharge port are also arranged to the vacuum vessel 19 in a state, for example, shown in FIG. 1.

In the described and shown embodiment, the superconducting coils 4a, 4b, 4c, and 4d are constituted as circular coils, arranged in the four quadrants on a horizontal plane of the cylindrical vacuum vessel 19, i.e., coolant vessel 5, respectively, and dipped in a liquid coolant. Further, the present invention may include a case in which the superconducting coils include at least two pairs of superconducting coils arranged on a same horizontal plane of the cylindrical vacuum vessel, and each of the paired superconducting coils includes coils set so as to oppose to each other with respect to a central axis of the cylindrical vacuum vessel. The direction of a magnetic field generated by the superconducting coils 4a, 4b, 4c, and 4d is transversal with respect to the pulling direction of a pulling furnace 1(described later). In this arrangement, one coil of one pair of coils and one coil of another pair of coils adjacent to that one pair of coils constitutes a set angle, directing towards the inside of the cylindrical vessel, in a range of 100° to 130°.

A space distance L between opposing coils of the superconducting coils 4a, 4b, 4c, and 4d is set to be 1.1 to 1.25 times an opening diameter D of the cylindrical vacuum vessel 19, and a coil diameter d of each of the superconducting coils 4a, 4b, 4c, and 4d is set to be 0.35 to 0.55 times the opening diameter D.

Figure 2:
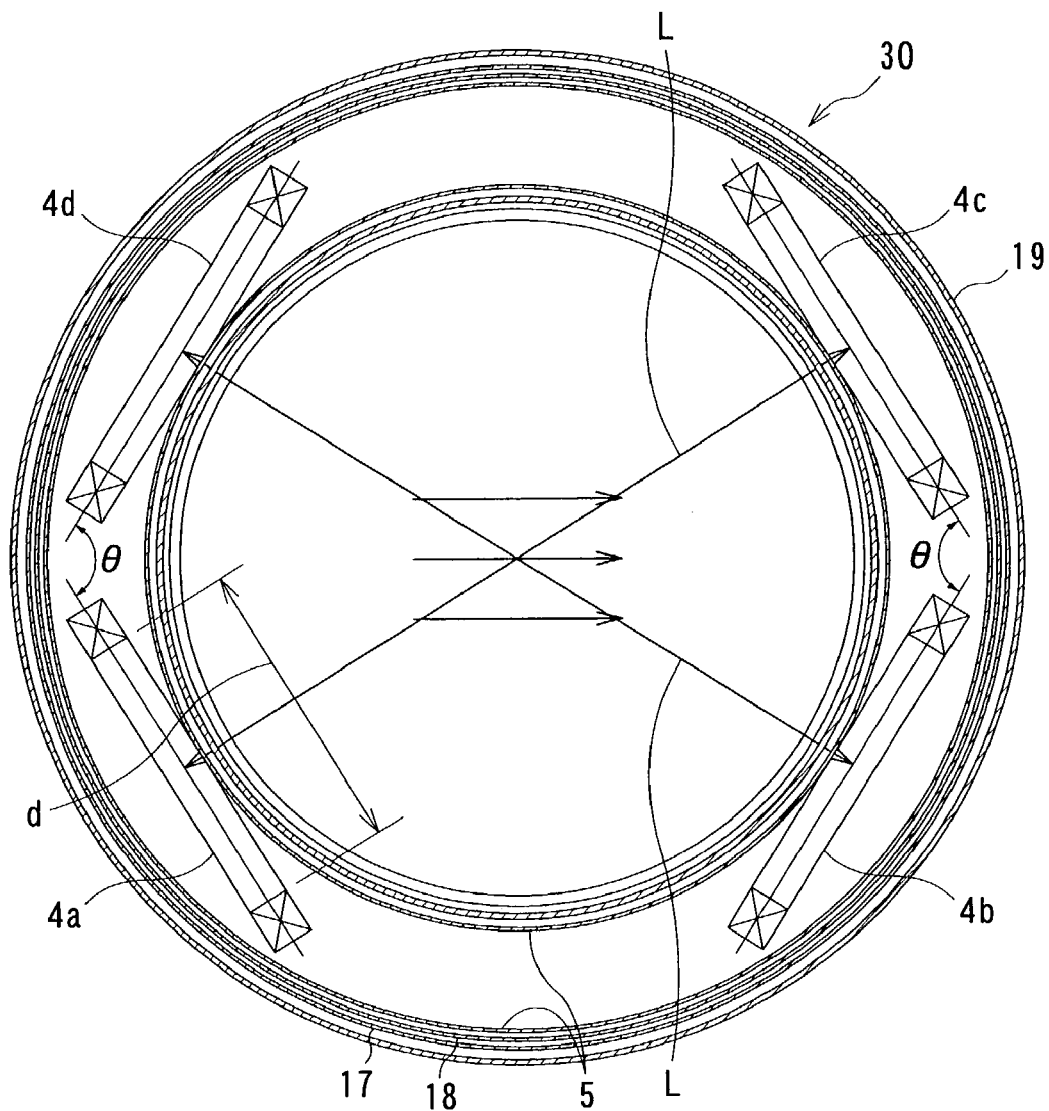
FIG. 2 is a sectional view showing the superconducting magnet taken along the line II—II in FIG. 1.
Figure 3:
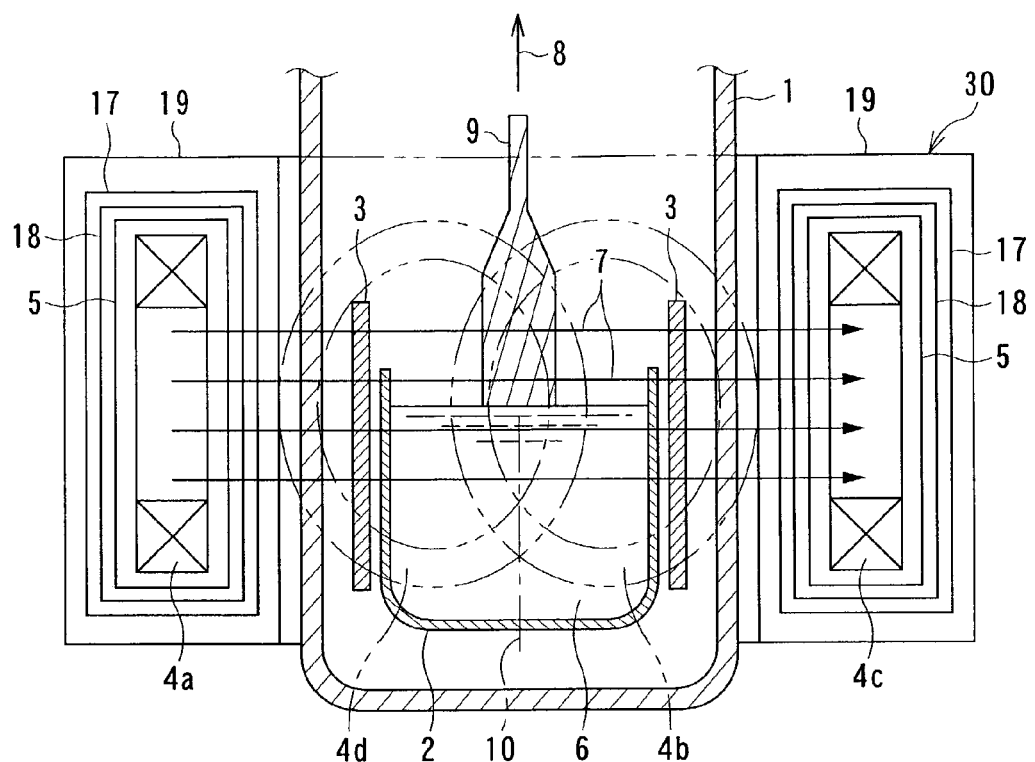
FIG. 3 is a sectional view showing a single-crystal pulling device including the superconducting magnet taken along the line III—III in FIG. 1.
Figure 18:
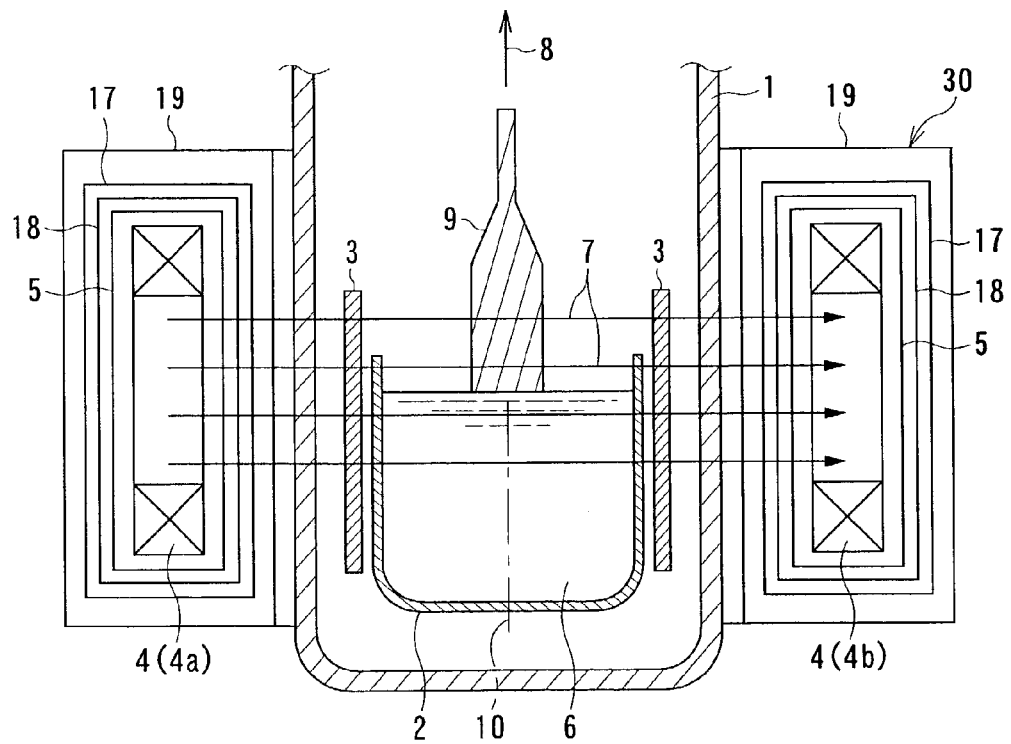
FIG. 18 is a sectional view schematically showing a conventional superconducting magnet.
Figure 19:
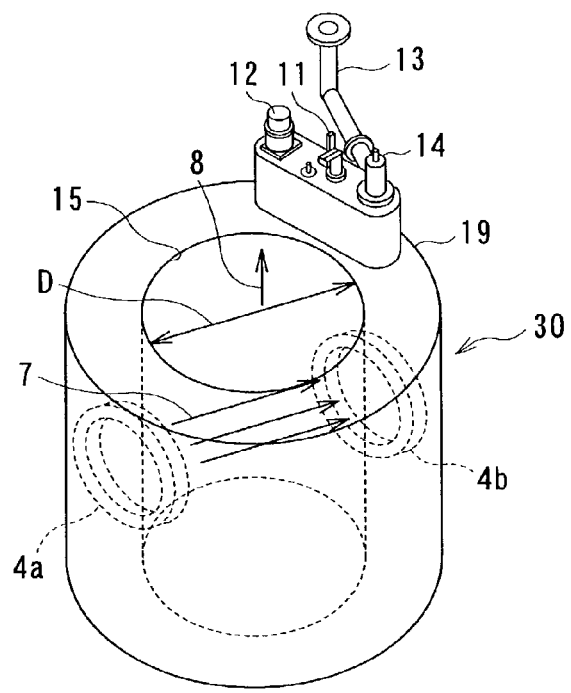
FIG. 19 is a perspective view, similar to FIG. 1, but showing a conventional single-crystal pulling device.
Figure 20:
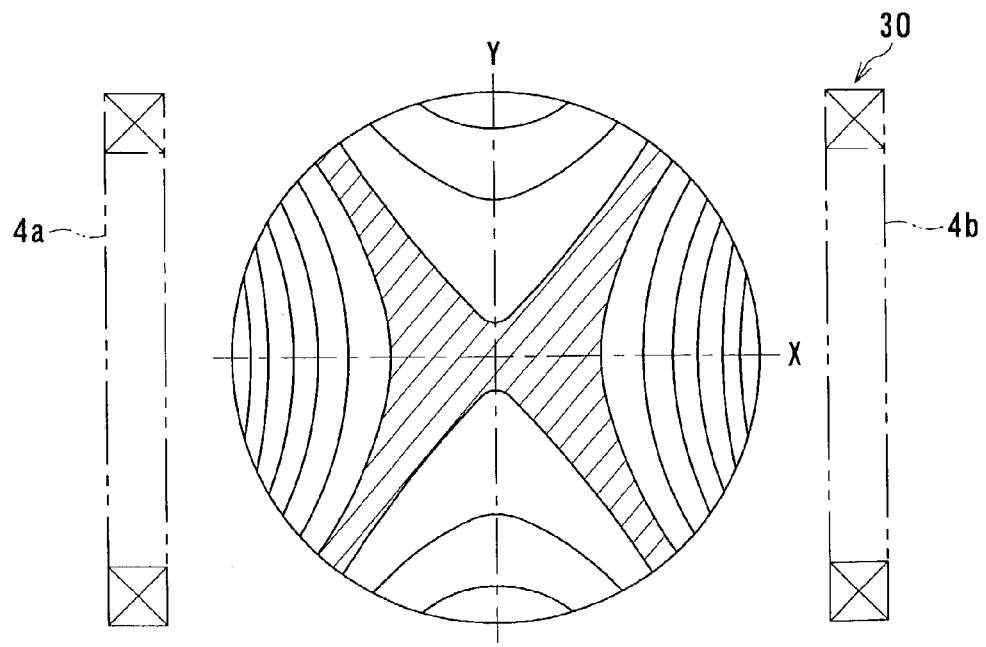
FIG. 20 is a diagram showing a conventional magnetic field distribution.

FIG. 3 shows a single-crystal pulling device including the superconducting magnet 30 coaxially assembled on the peripheral side of the pulling furnace 1. The configuration of the single-crystal pulling device shown in FIG. 3 is almost the same, in substantially the entire structure, as the configuration of the conventional single-crystal pulling device shown in FIG. 18. Accordingly, like reference numerals are added to elements or members corresponding to those shown in FIGS. 1 and 2 and the description thereof will be omitted. However, in the single-crystal pulling device according to this embodiment, magnetic fields are generated from the periphery of a crucible 2 accommodating a semiconductor material 6 therein in two directions, which transversely cross, by the four superconducting coils 4a, 4b, 4c, and 4d.

FIGS. 4 to 9 show magnetic field distributions of this embodiment formed by the configuration mentioned above, and FIGS. 10 and 11 show magnetic field distributions serving, on the contrary, as comparative examples to this embodiment.

Figure 4:
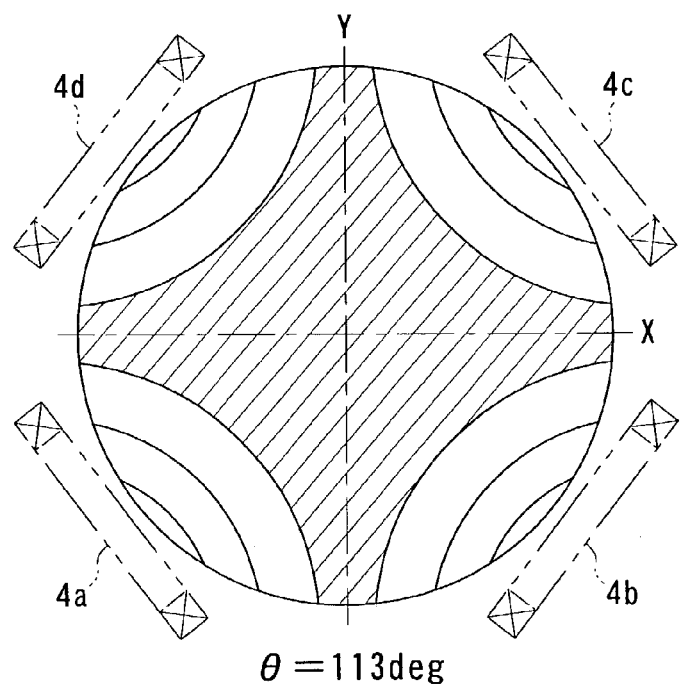
FIGS. 4 to 9 show diagrams of magnetic field distributions of cases having different set angles θ of the superconducting coils, in FIG. 2, of the embodiment of the present invention.

More specifically, FIG. 4 shows an optimum example of this embodiment, in which a magnetic field is most preferable, having set angles θ of the superconducting coils 4a, 4b, 4c, and 4d are set at 113°. As indicated by the hatched area in FIG. 4, a center of magnetic field is almost diamond-shaped and occupies a uniform wide region in both the X- and Y-directions. When the magnetic field is given to the melted semiconductor material 6 as shown in FIG. 3, the convection of the melt, especially, convection at the central part of the crucible is effectively suppressed, and a single crystal 9 pulled upward becomes uniform as a whole. Defects occurring in the peripheral portion of the single crystal 9 of the conventional structure could not be detected in the single crystal 9 of this embodiment of the present invention.

Figure 5:
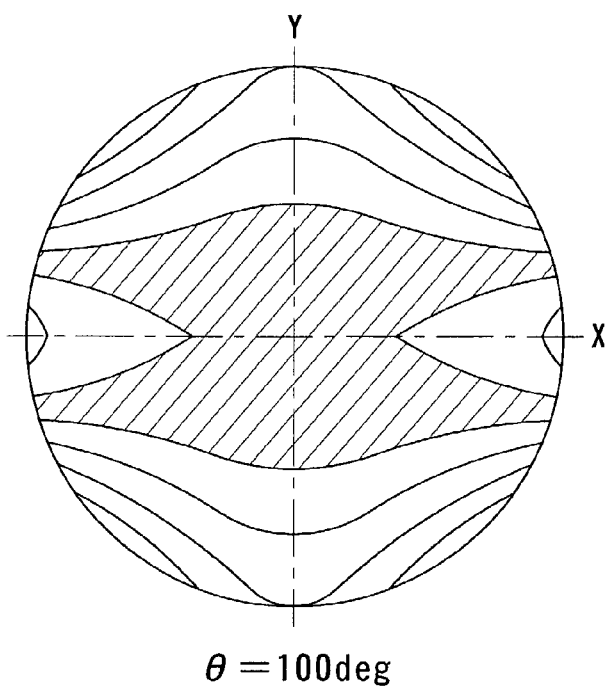
Figure 6:
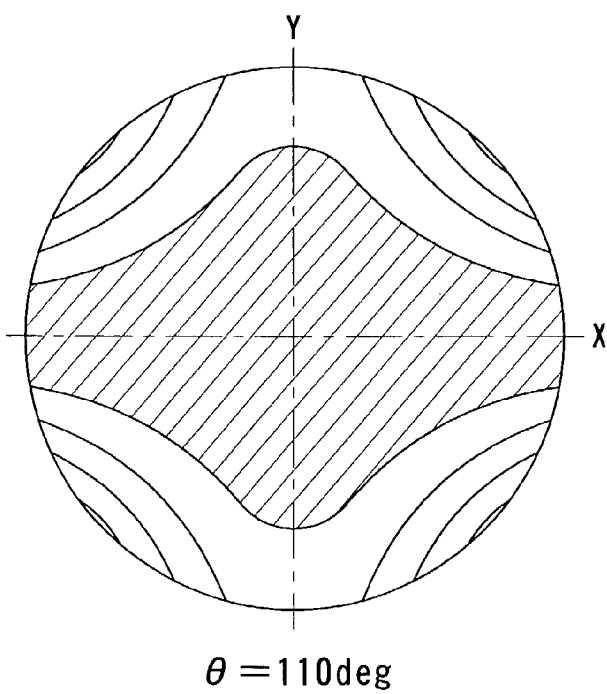
Figure 7:
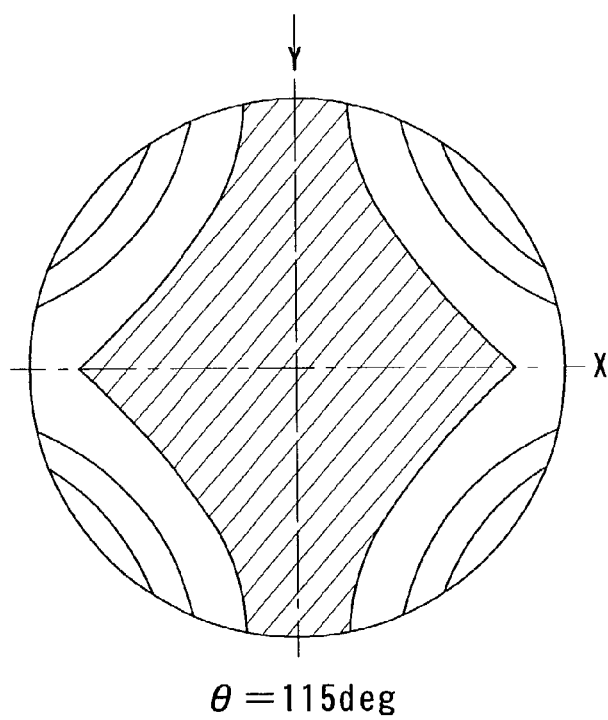
Figure 8:
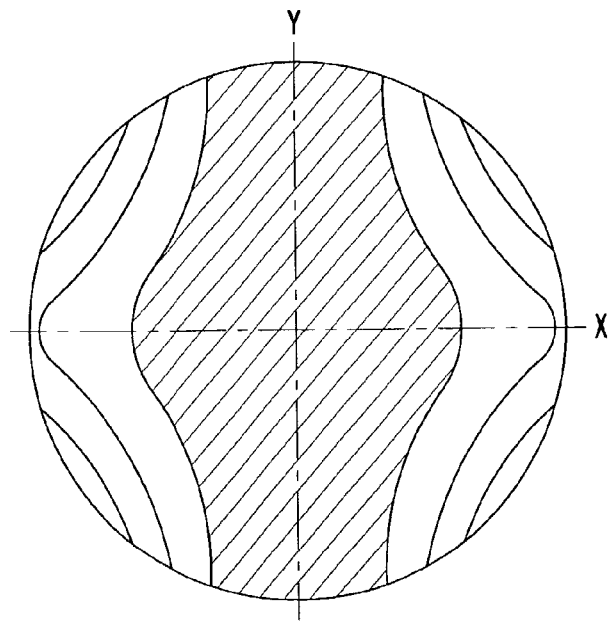
Figure 9:
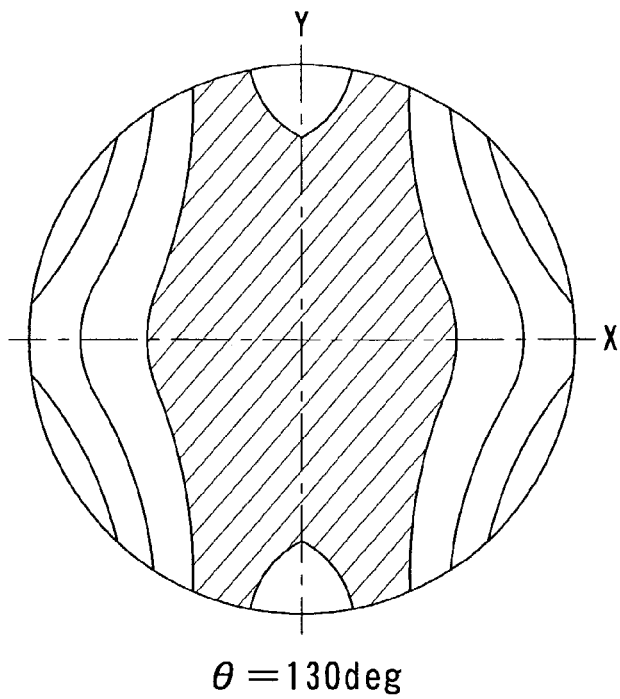

FIGS. 5 to 9 show magnetic field distributions obtained when the set angles θ of the superconducting coils 4a, 4b, 4c, and 4d are sequentially set at 100°, 110°, 115°, 120° and 130°. Further, in the shown magnetic field distributions, the central magnetic field is uniformly arranged over a sufficiently wide region. In the regions in which the set angles θ are small as shown in FIGS. 5 and 6, the central magnetic fields appear to be slightly elongated in the X-direction. On the other hand, as shown in FIGS. 7 to 9, when the set angles θ increase, the central magnetic fields appear to be slightly elongated in the Y-direction.

Figure 10:
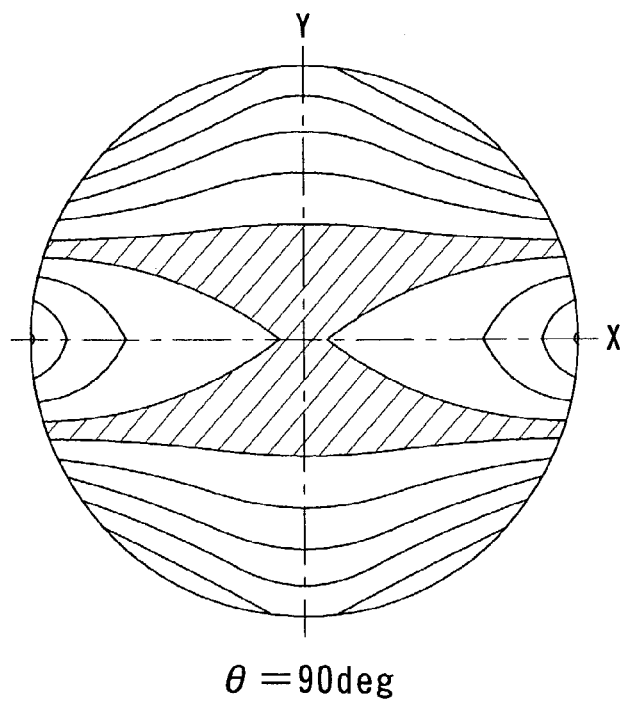
FIGS. 10 and 11 show diagrams of comparative examples to the embodiments of FIGS. 4 to 9.
Figure 11:
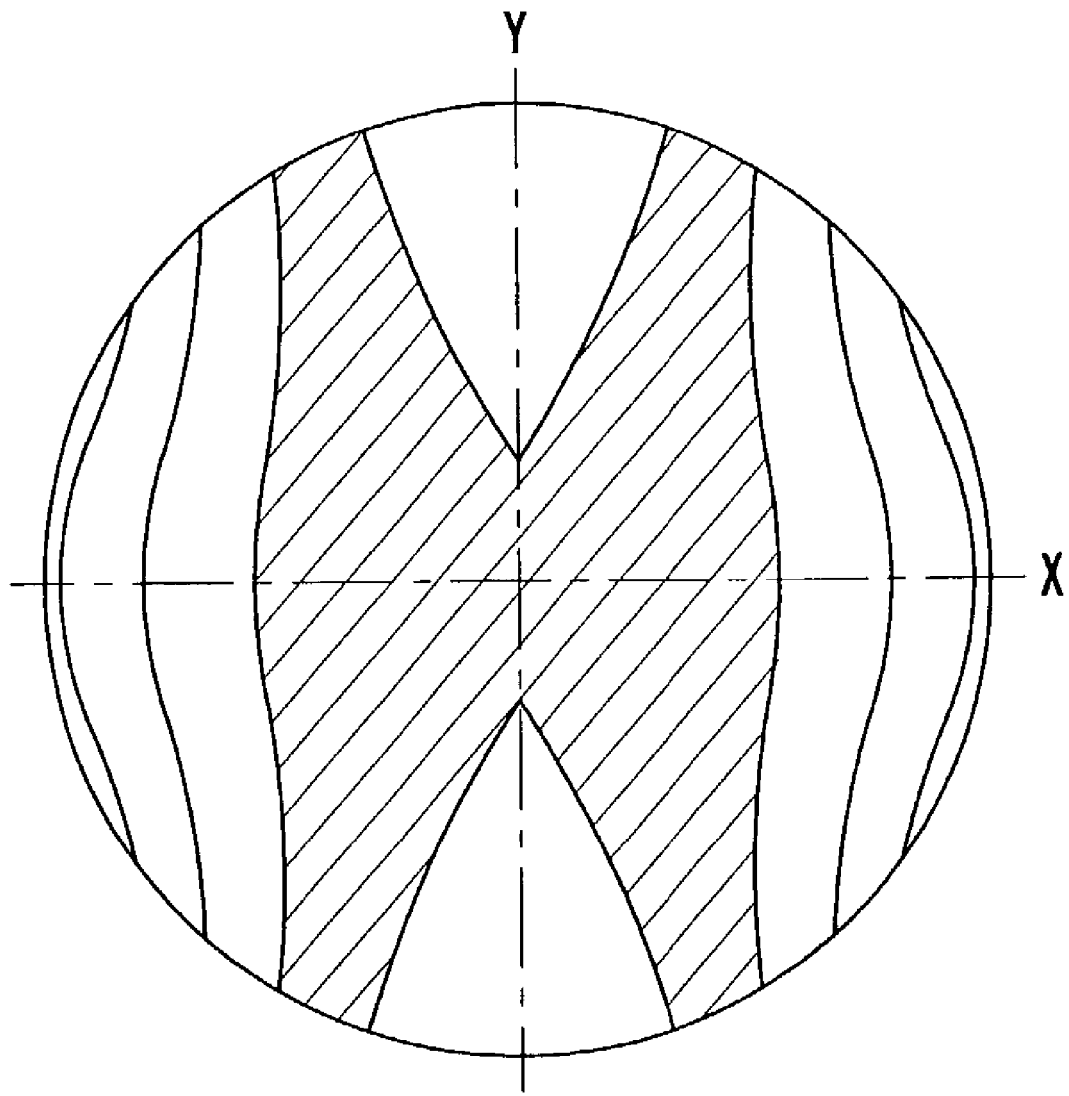

On the contrary, as shown in FIG. 10, in the comparative example in which the set angle θ is small, i.e., 90°, the width of the central magnetic field becomes extremely small. Furthermore, as shown in FIG. 11, in the comparative example in which the set angle θ is large, i.e., 140°, the width of the central magnetic field in the X-direction becomes extremely small.

In the superconducting magnet 30 according to the described embodiment, the two pairs of circular coils are arranged in the same vessel so that the pairs of coils oppose to each other, and the set angles are set within the range of 100° to 130°. In this manner, a coaxial uniform magnetic field or a tetragonally inclined uniform magnetic field can be obtained inside the bore of the vessel.

When the distance L between the opposing paired coils (4a, 4c, for example) is set within the range of lengths 1.1 to 1.25 times the opening (bore) diameter D, and the coil diameter d is set to be 0.35 to 0.55 times the opening (bore) diameter D, tendencies of the magnetic field distributions shown in FIGS. 4 to 9 will appear to be further certain and remarkable. Therefore, when these elements (coils) are set in consideration of the set angles θ, a magnetic field distribution having higher uniformity will be obtainable.

Figure 12:
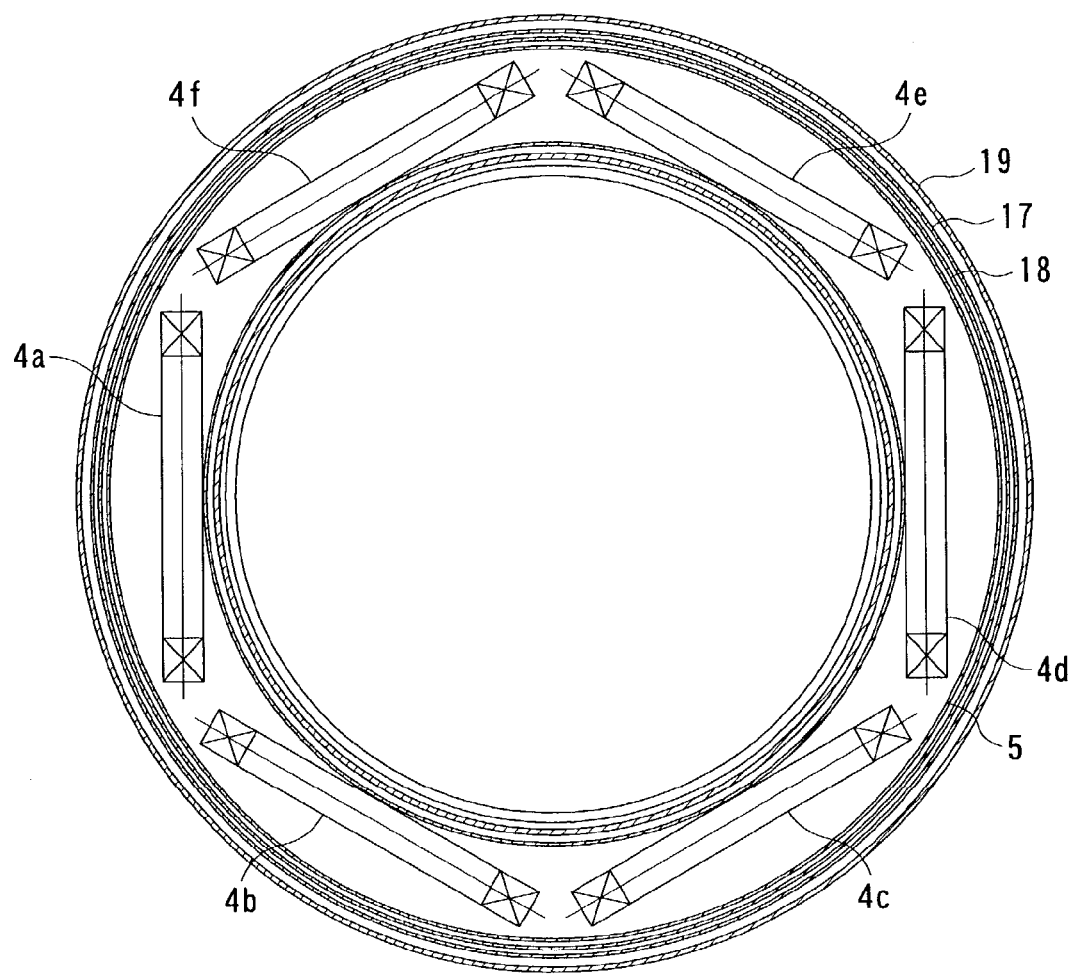
FIG. 12 is a sectional view, similar to FIG. 2, partially schematically showing another embodiment of a superconducting magnet according to the present invention.
Figure 13:
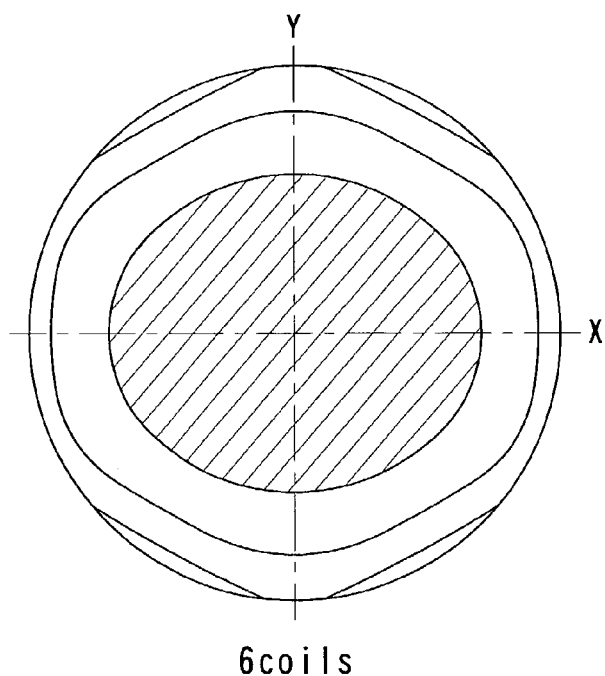
FIG. 13 is a diagram showing a magnetic field distribution in the embodiment shown in FIG. 12.

FIG. 12 shows another example of the embodiment in which six superconducting coils 4 (4a, 4b, 4c, 4d, 4e, and 4f) are accommodated in the cylindrical coolant vessel 5. The set angles θ are set to be the same as those shown in FIG. 2. FIG. 13 is a diagram showing a magnetic field distribution obtained in this case. As shown in FIG. 13, when the number of superconducting coils is increased, the central magnetic field is more stably spread. In this manner, when the number of coils is set to be an even number which is 6, 8 or more, the uniformity can be more improved. In addition, a depression of the magnetic field on a plane will be suppressed to the minimum level.

Figure 14:
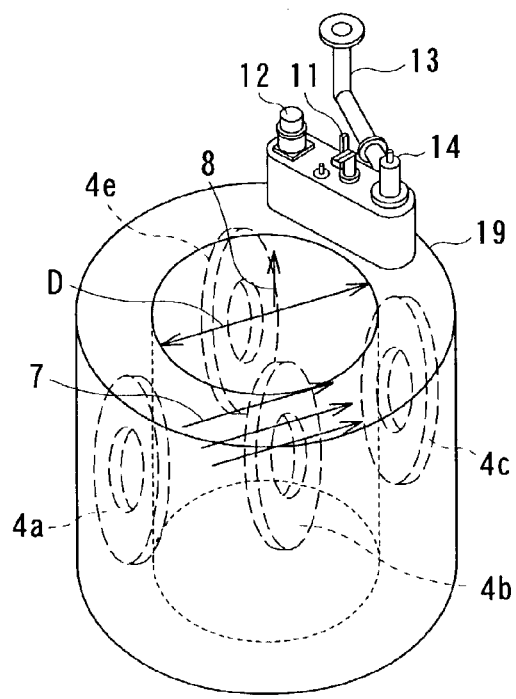
FIG. 14 is a perspective view, similar to FIG. 1, partially schematically showing still another embodiment of a superconducting magnet according to the present invention.

FIG. 14 shows a configuration in which the superconducting coil 4 accommodated in the cylindrical coolant vessel 5 has a racetrack shape, an ellipse, or a rectangle which is elongated in the same direction as the single crystal pulling direction 8, i.e., in the longitudinal direction, two pairs of superconducting coils 4 are arranged so that the pairs of the superconducting coils 4 oppose to each other with respect to the central axis of the vacuum vessel (i.e., coolant vessel), and the direction of the magnetic field generated by the superconducting coils 4 transversely crosses the pulling direction 8 of the pulling furnace 1.

According to the configuration described above such as shown in FIG. 14, the dimension of the semiconductor material 6 in the direction of depth in the crucible 2 is larger than the dimension of the semiconductor material 6 obtained when circular superconducting coils are used, so that the uniformity in the longitudinal direction of the magnetic field region can be improved, and thus, the uniformity of the magnetic field is more improved.

Figure 15:
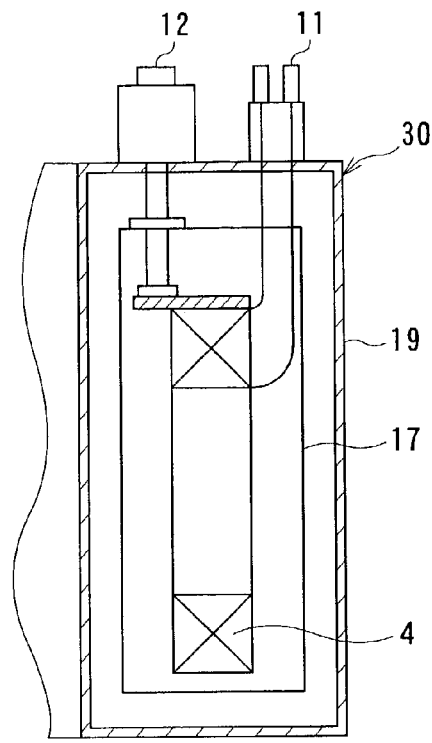
FIG. 15 is a schematic sectional view showing still another embodiment of a superconducting magnet according to the present invention.

FIG. 15 is a longitudinal sectional view showing another embodiment of the superconducting magnet 30 according to the present invention. This embodiment is different from the above embodiment in the structure, and that is, in the structure of this embodiment, the service port 14 having a refrigerant resupplying port shown in FIG. 1 is omitted. The other arrangements are the same as those in FIGS. 1 to 3.

In this embodiment shown in FIG. 15, a coolant (refrigerant or cooling medium) and a coolant vessel for accommodating the coolant are not arranged, and the superconducting coils 4 are cooled by a small helium refrigerator 12. The superconducting coils 4 are covered with a radiation shield 17, which is accommodated in the vacuum vessel 19. The current lead 11 is designed to supply a current to the superconducting coils 4.

With such configuration, the superconducting coils 4 are cooled by the refrigerator 12 to make it possible to hold a superconducting state. Accordingly, it is not necessary to use the cooling medium such as liquid helium, thus reducing and saving the cost required to resupply the cooling medium.

Figure 16:
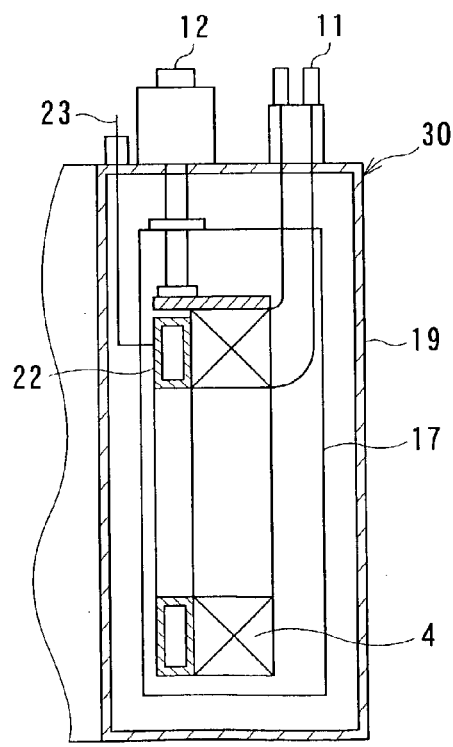
FIG. 16 is a schematic sectional view showing still another embodiment of a superconducting magnet according to the present invention.

FIG. 16 shows a further example of the superconducting magnet 30 having a configuration in which a small coolant vessel 22 is disposed so as to be connected to the superconducting coils 4. The other arrangements in FIG. 16 are the same as those in FIG. 15.

In the embodiment of FIG. 16, the superconducting coils 4 are cooled by the small helium refrigerator 12 and the small coolant vessel 22. The coolant is poured from an inlet 23 into the small coolant vessel 22.

According to this embodiment of FIG. 16, even in a case where the small helium refrigerator 12 stops in operation, the cooling medium is reserved in the small coolant vessel 22, so that the superconducting coils 4 can keep their superconducting states.

Figure 17:
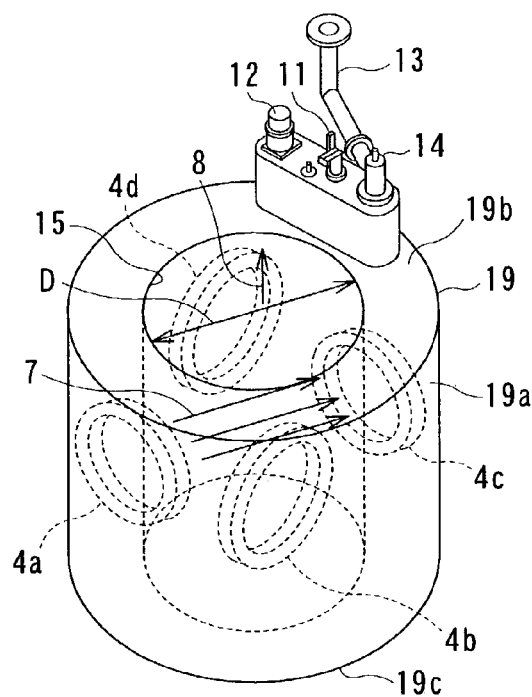
FIG. 17 is a perspective view, similar to FIG. 1, partially schematically showing still another embodiment of a superconducting magnet according to the present invention.

FIG. 17 shows a still further embodiment of the present invention having a structure in which any one or all of peripheral wall 19a, and upper and lower walls 19b and 19c of the cylindrical vacuum vessel 19, of the structure shown in FIG. 1, are composed of a magnetic material such as iron-based metal or the like. The other arrangements in FIG. 17 are the same as those in FIG. 1.

According to this embodiment of FIG. 17, since the vacuum vessel 19 is composed of the magnetic material, a magnetic field generated by the superconducting coils 4 can be absorbed by the magnetic material of the vacuum vessel itself. Therefore, a magnetic field leaking to the periphery can be weakened. For example, even in a case where instruments and gauges or the like are arranged at the peripheral area of the suprconducting magnet, it can be safely operated.

According to the superconducting magnet and the single-crystal pulling device utilizing such superconducting magnet, the transverse magnetic field having an improved uniform small magnetic-field gradient can be generated inside the cylindrical vacuum vessel. In addition, the coaxial or square magnetic field distribution can be generated on the same horizontal plane of the vacuum vessel, and an imbalanced electromagnetic force can be considerably suppressed. Accordingly, the single-crystal material can be pulled up in a stabled manner.

Further, it is to be noted that the present invention is not limited to the described embodiments and many other changes and modifications may be made without departing from the scope of the appended claims.

What is claimed is:

1. A single crystal pulling device comprising:
   a cylindrical pulling furnace;
   a crucible disposed in the pulling furnace so as to melt a single crystal material for a semiconductor poured therein;
   a cylindrical vacuum vessel coaxially disposed around an outer periphery of the pulling furnace; and
   a superconducting element disposed in the vacuum vessel so as to generate magnetic field which is applied to the single crystal material to thereby suppress a convection of the melted single-crystal material in the crucible,
   wherein said superconducting element comprises at least two pairs of superconducting coils arranged on a same horizontal plane of the cylindrical vacuum vessel, wherein the at least two pairs of superconducting coils are Helmholtz coils that generate a magnetic field along a same transverse direction, and each of the paired superconducting coils includes coils set so as to oppose to each other with respect to a central axis of the cylindrical vacuum vessel so that one coil of one pair of coils and one coil of another pair of coils adjacent to the first mentioned one pair of coils constitutes a set angle, directing towards the inside of the cylindrical vessel, in a range of 100° to 130°.

2. A single crystal pulling device according to claim 1, wherein a space distance between the opposing superconducting coils is set to be 1.1 to 1.25 times a diameter of an opening of the cylindrical vacuum vessel.

3. A single crystal pulling device according to claim 1, wherein each of said superconducting coils has a diameter which is 0.35 to 0.55 times the diameter of the opening of the cylindrical vacuum vessel.

4. A single crystal pulling method, which is performed by using a single-crystal pulling device which comprises a cylindrical pulling furnace, a crucible disposed in the pulling furnace, a cylindrical vacuum vessel coaxially disposed around an outer periphery of the pulling furnace, and a superconducting element disposed in the vacuum vessel,
   wherein a single crystal material is poured in the crucible, then heated and melted, a seed crystal is inserted into the crucible from an upper portion thereof and the single crystal material is thereafter pulled up at a predetermined speed, while applying a magnetic field generated by the superconducting element to thereby suppress a convection of the melted single crystal material in the crucible, and said superconducting element comprises at least two pairs of superconducting coils arranged on a same horizontal plane of the cylindrical vacuum vessel, wherein the at least two pairs of superconducting coils are Helmholtz coils that generate a magnetic field along a same transverse direction, and each of the paired superconducting coils includes coils set so as to oppose to each other with respect to a central axis of the cylindrical vacuum vessel so that one coil of one pair of coils and one coil of another pair of coils adjacent to the first mentioned one pair of coils constitutes a set angle, directing towards the inside of the cylindrical vessel, in a range of 100° to 130°.

5. A superconducting magnet comprising:

a cylindrical vacuum vessel; and a superconducting element disposed in the cylindrical so as to generate magnetic field, said superconducting element comprising at least two pairs of superconducting coils arranged on a same horizontal plane of the cylindrical vacuum vessel, wherein the at least two pairs of superconducting coils are Helmholtz coils that generate a magnetic field along a same transverse direction, and each of the paired superconducting coils includes coils set so as to oppose to each other with respect to a central axis of the cylindrical vacuum vessel so that one coil of one pair of coils and one coil of another pair of coils adjacent to the first mentioned one pair of coils constitutes a set angle, directing towards the inside of the cylindrical vessel, in a range of 100° to 130°.

6. A superconducting magnet according to claim 5, wherein a space distance between the opposing superconducting coils is set to be 1.1 to 1.25 times a diameter of an opening of the cylindrical vacuum vessel.

7. A superconducting magnet according to claim 5, wherein each of said superconducting coils has a diameter which is 0.35 to 0.55 times the diameter of the opening of the cylindrical vacuum vessel.

8. A superconducting magnet according to claim 5 wherein the superconducting coil has a shape of either one of racetrack shape, elliptical shape and rectangular shape, which is elongated in the axial direction of the vacuum vessel.

9. A superconducting magnet according to claim 5 further comprising a cooling vessel, coaxially disposed in the cylindrical vacuum vessel.

10. A superconducting magnet according to claim 9, wherein the superconducting coils are disposed in the cooling vessel in which a liquid cooling medium is filled up.

11. A superconducting magnet according to claim 9, wherein the superconducting coils are contacted to the cooling vessel.

12. A superconducting magnet according to claim 5, wherein the superconducting coils are connected to a low-temperature portion of a refrigerator.

13. A superconducting magnet according to claim 5, wherein the cylindrical vacuum vessel has a wall section, on the outside of the superconducting coils, formed from a magnetic material.

* * * * *